(12) United States Patent
Kwak (10) Patent No.: US 10,224,082 B2
(45) Date of Patent: *Mar. 5, 2019

(54) SEMICONDUCTOR DEVICE AND METHOD OF OPERATION (71) Applicant: SK hynix Inc., Icheon-si, Gyeonggi-do (KR)

(72) Inventor: Nohhyup Kwak, Seoul (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 0 days.

This patent is subject to a terminal disclaimer.

(21) Appl. No.: 16/010,008

(22) Filed: Jun. 15, 2018

(65) Prior Publication Data

US 2018/0294022 A1 Oct. 11, 2018

Related U.S. Application Data (63) Continuation of application No. 15/652,942, filed on Jul. 18, 2017, now Pat. No. 10,026,463.

(30) Foreign Application Priority Data

Mar. 15, 2017 (KR) .......................... 10-2017-0032720

(51) Int. Cl.
G11C 7/10 (2006.01)
G11C 7/22 (2006.01)
G11C 29/52 (2006.01)
G11C 29/04 (2006.01)

(52) U.S. Cl.
CPC .............. *G11C 7/222* (2013.01); *G11C 7/106* (2013.01); *G11C 7/1009* (2013.01); *G11C 29/52* (2013.01); *G11C 2029/0409* (2013.01)

(58) Field of Classification Search
CPC ....... G11C 7/222; G11C 7/1009; G11C 7/106; G11C 29/52; G11C 2029/0409
USPC ...................................... 365/189.05
See application file for complete search history.

(56) References Cited

U.S. PATENT DOCUMENTS 7,420,872 B2 9/2008 Yang et al.
10,026,463 B1* 7/2018 Kwak ................... G11C 7/222
2003/0043944 A1 3/2003 Fukuda
2015/0302907 A1 10/2015 Hadrick et al.

FOREIGN PATENT DOCUMENTS

KR 1020140126225 A 10/2014

* cited by examiner

Primary Examiner — Huan Hoang
(74) Attorney, Agent, or Firm — William Park & Associates Ltd.

(57) ABSTRACT

A semiconductor device includes a clock shifting circuit suitable for shifting a write pulse which is synchronized with a clock, in response to write latency signals, and generating shifting pulses and a mask write read signal; and a flag generation circuit suitable for generating a mask write flag by latching a mask write command or outputting the mask write command as the mask write flag, in response to the shifting pulses.

15 Claims, 8 Drawing Sheets

SEMICONDUCTOR DEVICE AND METHOD OF OPERATION

CROSS-REFERENCE TO RELATED APPLICATION

The present application claims priority under 35 U.S.C. § 119(a) to Korean Patent Application No. 10-2017-0032720 filed on Mar. 15, 2017 in the Korean Intellectual Property Office, which is incorporated herein by reference in its entirety.

BACKGROUND

1. Technical Field

Embodiments of the present disclosure may generally relate to a semiconductor device and an error scrub operation.

2. Related Art

Recently, in order to increase the operating speed of a semiconductor device, DDR2 or DDR3 signaling is used, in which 4-bit or 8-bit data are inputted and outputted (inputted/outputted) in each clock cycle. In the case where an input and output (input/output) speed of data is increased, the probability of an error occurring during a data transmission process increases. Therefore, a separate device and method for ensuring the reliability of data transmission is needed.

SUMMARY

In an embodiment, a semiconductor device may be provided. The semiconductor device may include a clock shifting circuit configured for shifting a write pulse which is synchronized with a clock, based on write latency signals, and generating shifting pulses and a mask write read signal. The semiconductor device may include a flag generation circuit configured for generating a mask write flag by latching a mask write command or outputting the mask write command as the mask write flag, based on the shifting pulses.

In an embodiment, a semiconductor device may be provided. The semiconductor device may include a first latch configured for latching a mask write command in synchronization with a first shifting pulse, and outputting an output signal. The semiconductor device may include a second latch configured for latching the output signal of the first latch in synchronization with a second shifting pulse, and outputting an output signal. The semiconductor device may include a first selector configured for transferring the output signal of the first latch to the second latch or transferring the mask write command to the second latch, based on a first select control signal. The semiconductor device may include a second selector configured for outputting the output signal of the second latch or outputting the mask write command, based on a second select control signal. The semiconductor device may include a third selector configured for outputting an output signal of the second selector as a mask write flag or outputting the mask write command as the mask write flag, based on a delay select signal.

In an embodiment, a semiconductor device may be provided. The semiconductor device may include a delay control circuit configured for generating first and second select control signals and a delay select signal based on write latency signals. The semiconductor device may include a flag generation circuit configured for generating a mask write flag by latching a mask write command or outputting the mask write command as the mask write flag, based on the first and second select control signals and the delay select signal.

In an embodiment, a method of performing an error scrub operation may be provided. The method may include shifting, with a clock shifting circuit, a write pulse which is synchronized with a clock, based on write latency signals, and generating shifting pulses. The method may include generating, with a flag generation circuit, a mask write flag by latching a mask write command or outputting the mask write command as the mask write flag, based on the shifting pulses.

In an embodiment, a method of performing an error scrub operation may be provided. The method may include latching, with a first latch, a mask write command in synchronization with a first shifting pulse, and outputting an output signal. The method may include latching, with a second latch, the output signal of the first latch in synchronization with a second shifting pulse, and outputting an output signal. The method may include transferring, with a first selector, the output signal of the first latch to the second latch or transferring the mask write command to the second latch, based on a first select control signal. The method may include outputting, with a second selector, the output signal of the second latch or outputting the mask write command, based on a second select control signal. The method may include outputting, with a third selector, an output signal of the second selector as a mask write flag or outputting the mask write command as the mask write flag, based on a delay select signal.

DETAILED DESCRIPTION

Hereinafter, a semiconductor device may be described below with reference to the accompanying drawings through various examples of embodiments.

Various embodiments may be directed to a semiconductor device capable of controlling a timing for performing an internal read operation for an error scrub operation.

According to the embodiments, by controlling a timing for performing an internal read operation for an error scrub operation, depending on a latency, it may be possible to stably perform the error scrub operation even though an operating frequency changes.

For reference, an embodiment including additional components may be provided. Furthermore, an active high or active low configuration indicating an active state of a signal or circuit may be changed depending on embodiments. Furthermore, the configuration of a logic gate or logic gates required for implementing the same function or operation may be modified. That is, the logic gate configuration of one type of operation and another logic gate configuration for the same type of operation may be replaced with each other, depending on a specific situation. If necessary, various logic gates may be applied to implement the configurations.

Figure 1:
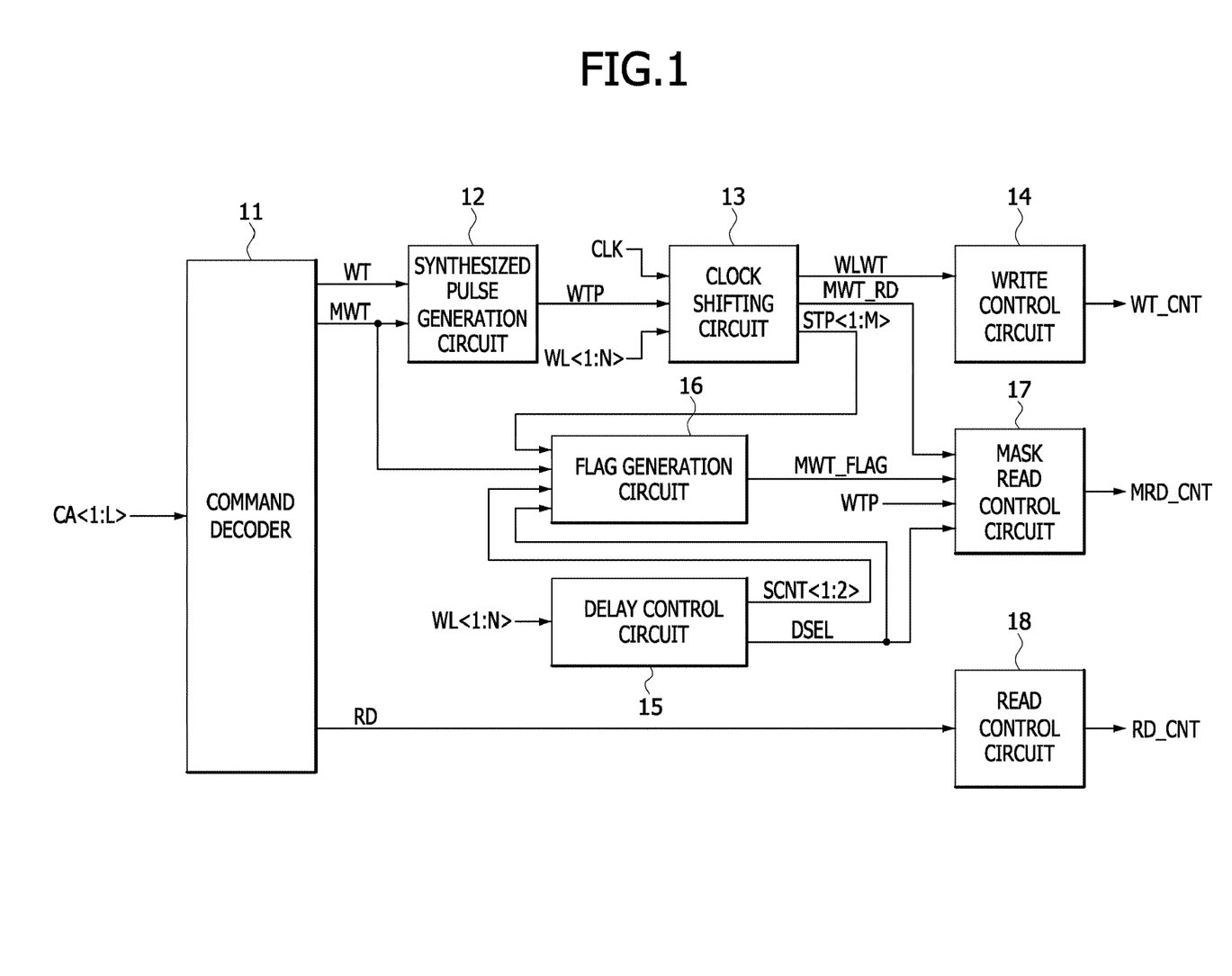
FIG. 1 is a block diagram illustrating a representation of an example of the configuration of a semiconductor device in accordance with an embodiment.

Referring to FIG. 1, a semiconductor device in accordance with an embodiment may include a command decoder 11, a synthesized pulse generation circuit 12, a clock shifting circuit 13, a write control circuit 14, a delay control circuit 15, a flag generation circuit 16, a mask read control circuit 17, and a read control circuit 18.

The command decoder 11 may generate a write command WT, a mask write command MWT and a read command RD in response to external control signals CA<1:L>. The external control signals CA<1:L> may include at least one of a command and an address. The command decoder 11 may selectively generate the write command WT, the mask write command MWT and the read command RD by decoding the command included in the external control signals CA<1:L>. The write command WT may be enabled for a write operation in which data are stored in cells (not illustrated). The mask write command MWT may be enabled for a mask write operation in which some bits included in data are written in a masked state. The read command RD may be enabled for a read operation in which data stored in cells (not illustrated) are outputted. The bit number L of the external control signals CA<1:L> may be set variously according to embodiments.

The synthesized pulse generation circuit 12 may generate a write pulse WTP in response to the write command WT and the mask write command MWT. The synthesized pulse generation circuit 12 may generate the write pulse WTP by synthesizing the write command WT and the mask write command MWT. The synthesized pulse generation circuit 12 may generate the write pulse WTP in the case where the write command WT or the mask write command MWT is generated. The configuration and operation of the synthesized pulse generation circuit 12 will be described below with reference to FIG. 2.

The clock shifting circuit 13 may generate first to M^th shifting pulses STP<1:M>, a mask write read signal MWT_RD and a latency write signal WLWT from the write pulse WTP in response to first to N^th write latency signals WL<1:N> and a clock CLK. The clock shifting circuit 13 may sequentially generate the first to M^th shifting pulses STP<1:M>, the mask write read signal MWT_RD and the latency write signal WLWT by shifting the write pulse WTP in synchronization with the clock CLK. The clock shifting circuit 13 may control generation of the first to M^th shifting pulses STP<1:M> in response to the first to N^th write latency signals WL<1:N>. For example, the clock shifting circuit 13 may generate only the second shifting pulse STP<2> in the case where the first write latency signal WL<1> is enabled, and generate the first and second shifting pulses STP<1:2> in the case where the second write latency signal WL<2> is enabled. The bits included in the first to N^th write latency signals WL<1:N> may be set to be enabled selectively for predetermined periods of a write latency. For example, when N=2, the second write latency signal WL<2> may be set to be enabled in the case where a write latency is equal to or greater than 20, the first write latency signal WL<1> may be set to be enabled in the case where a write latency is less than 20 and equal to or greater than 10, and both the first write latency signal WL<1> and the second write latency signal WL<2> may be set to be disabled in the case where a write latency is less than 10. The bit number N of the first to N^th write latency signals WL<1:N> and the bit number M of the first to MAth shifting pulses STP<1:M> may be set variously according to embodiments. The configuration and operation of the clock shifting circuit 13 will be described below with reference to FIG. 3.

The write control circuit 14 may generate a write control signal WT_CNT in response to the latency write signal WLWT. The write control circuit 14 may generate the write control signal WT_CNT which is enabled to control a write operation in the case where the latency write signal WLWT is generated.

The delay control circuit 15 may generate first and second select control signals SCNT<1:2> and a delay select signal DSEL in response to the first to N^th write latency signals WL<1:N>. The delay control circuit 15 may generate the first and second select control signals SCNT<1:2> and the delay select signal DSEL of which logic level combinations are determined depending on the logic level combinations of the first to N^th write latency signals WL<1:N>. For example, the delay control circuit 15 may generate the second select control signal SCNT<2> and the delay select signal DSEL which are set to a first logic level in the case where the first write latency signal WL<1> is enabled, generate the first and second select control signals SCNT<1:2> and the delay select signal DSEL which are set to the first logic level in the case where the second write latency signal WL<2> is enabled, and generate the first and second select control signals SCNT<1:2> and the delay select signal DSEL which are set to a second logic level in the case where both the Is first and second write latency signals WL<1:2> are disabled. The first logic level and the second logic level may be set differently according to an embodiment. The bit number N of the first to N^th write latency signals WL<1:N> may be set variously according to embodiments. The configuration and operation of the delay control circuit 15 will be described below with reference to FIG. 5.

The flag generation circuit 16 may generate a mask write flag MWT_FLAG from the mask write command MWT in response to the first and second shifting pulses STP<1:2>, the first and second select control signals SCNT<1:2> and the delay select signal DSEL. The flag generation circuit 16 may generate the mask write flag MWT_FLAG of which generation time is controlled depending on the logic level combinations of the first and second shifting pulses STP<1:2> and the first and second select control signals SCNT<1:2> and the logic level combination of the delay select signal DSEL The configuration and operation of the flag generation circuit 16 will be described below with reference to FIG. 6.

The mask read control circuit 17 may generate a mask read control signal MRD_CNT from the write pulse WTP and the mask write read signal MWT_RD in response to the mask write flag MWT_FLAG and the delay select signal DSEL. The mask read control signal MRD_CNT may be set as a signal which is enabled to perform an internal read operation after the mask write command MWT is inputted for an error scrub operation. The mask read control circuit 17 may generate the mask read control signal MRD_CNT in synchronization with the generation time of the write pulse WTP or generate the mask read control signal MRD_CNT in synchronization with the generation time of the mask write read signal MWT_RD, depending on the generation time of the mask write flag MWT_FLAG and the logic level of the delay select signal DSEL. The configuration and operation of the mask read control circuit 17 will be described below with reference to FIG. 7.

The read control circuit 18 may generate a read control signal RD_CNT in response to the read command RD. The read control circuit 18 may generate the read control signal RD_CNT which is enabled to control a read operation in the case where the read command RD is generated.

Figure 2:
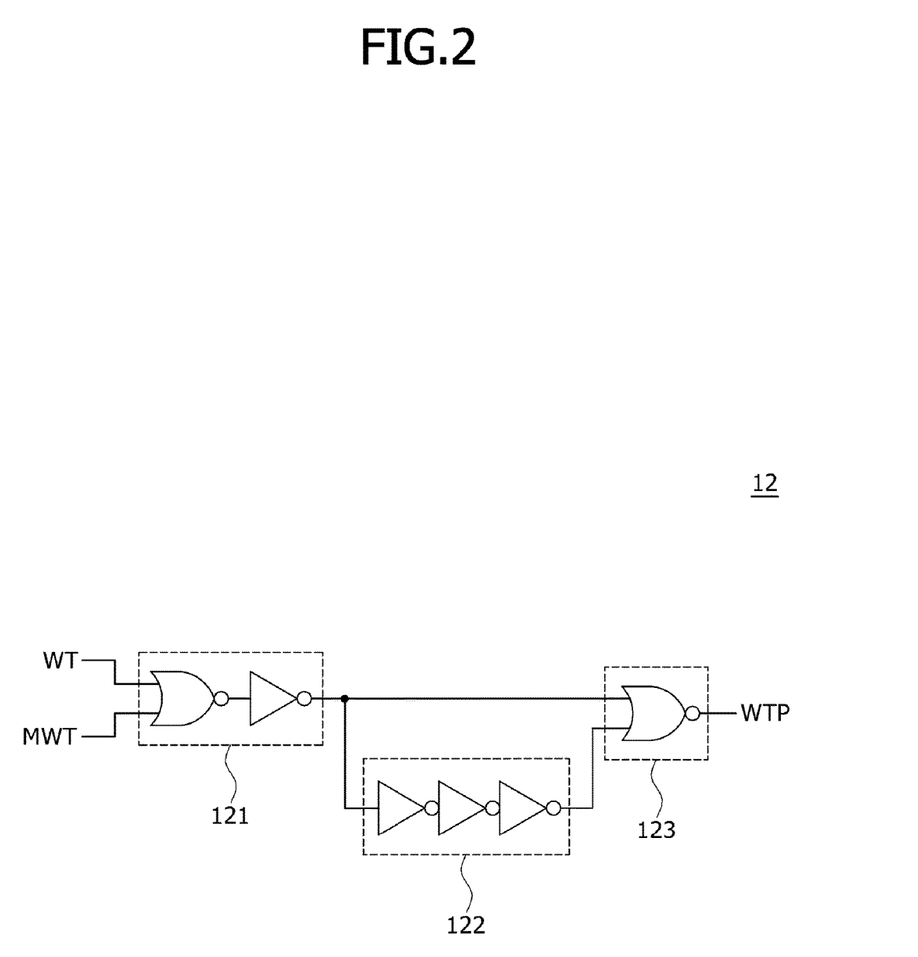
FIG. 2 is a circuit diagram illustrating a representation of an example of the synthesized pulse generation circuit included in the semiconductor device illustrated in FIG. 1.

Referring to FIG. 2, the synthesized pulse generation circuit 12 may include a command synthesizer 121, an inverter delay 122, and a pulse output 123.

The command synthesizer 121 may perform an OR logic function by receiving the write command WT and the mask write command MWT. The command synthesizer 121 may output a logic high level in the case where at least one of the write command WT and the mask write command MWT generates a logic high level. The inverter delay 122 may be embodied by an inverter chain, invert and delay the output signal of the command synthesizer 121, and output an output signal. The pulse output 123 may receive the output signal of the command synthesizer 121 and the output signal of the inverter delay 122, perform a NOR logic function, and generate the write pulse WTP.

The synthesized pulse generation circuit 12 may generate the write pulse WTP in the case where the write command WT or the mask write command MWT is generated.

Figure 3:
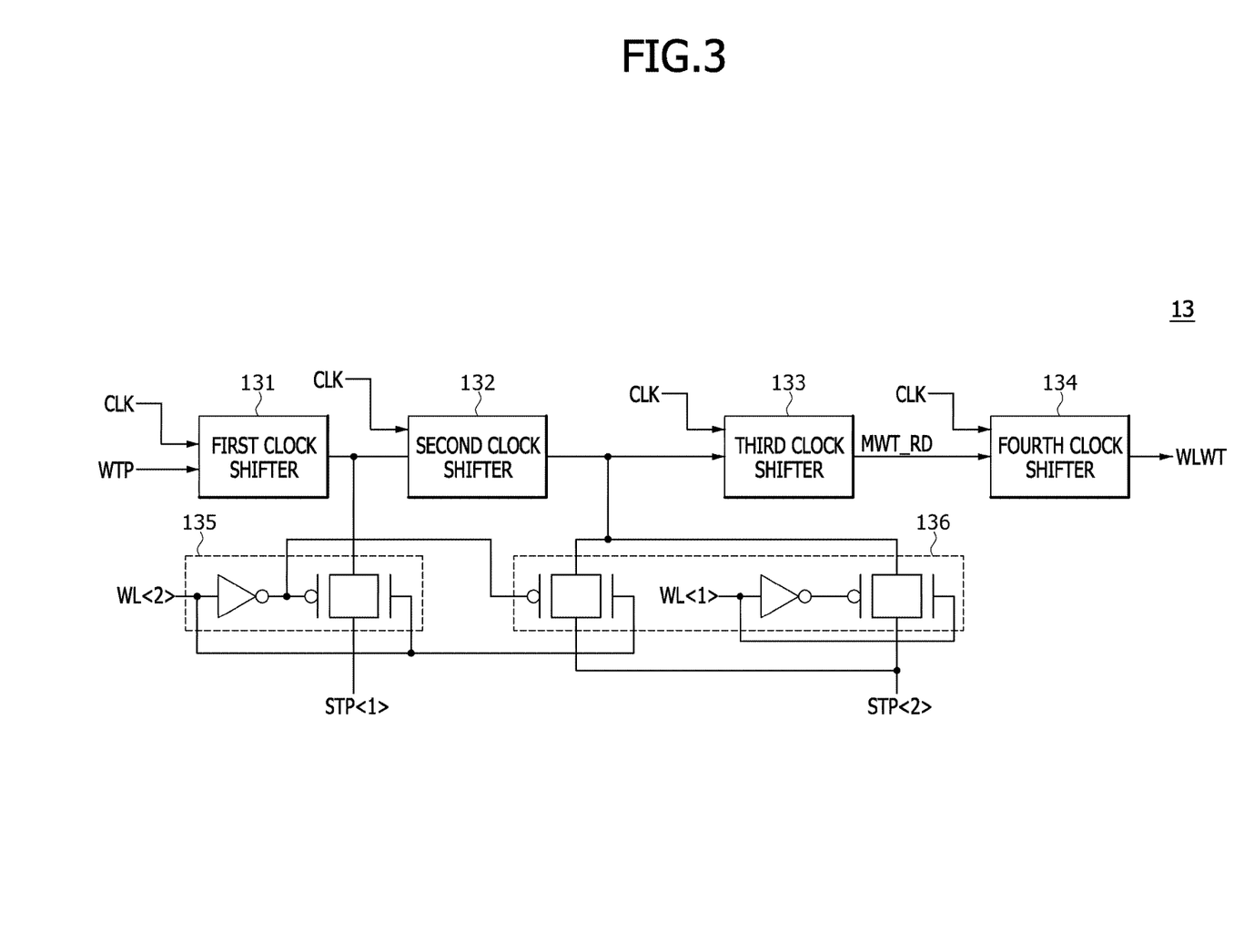
FIG. 3 is a diagram illustrating a representation of an example of the clock shifting circuit included in the semiconductor device illustrated in FIG. 1.

Referring to FIG. 3, the clock shifting circuit 13 may include a first clock shifter 131, a second clock shifter 132, a third clock shifter 133, a fourth clock shifter 134, a first shifting pulse output 135, and a second shifting pulse output 136.

The first clock shifter 131 may shift the write pulse WTP in synchronization with the clock CLK, and output an output signal. The first clock shifter 131 may shift the write pulse WTP by a period corresponding to N cycles of the clock CLK, and output the output signal. N may be set to a natural number.

The second clock shifter 132 may shift the output signal of the first clock shifter 131 in synchronization with the clock CLK, and output an output signal. The second clock shifter 132 may shift the output signal of the first clock shifter 131 by a period corresponding to N cycles of the clock CLK, and output the output signal. N may be set to a natural number.

The third clock shifter 133 may shift the output signal of the second clock shifter 132 in synchronization with the clock CLK, and output the mask write read signal MWT_RD. The third clock shifter 133 may shift the output signal of the second clock shifter 132 by a period corresponding to N cycles of the clock CLK, and output the mask write read signal MWT_RD. N may be set to a natural number.

The fourth clock shifter 134 may shift the mask write read signal MWT_RD in synchronization with the clock CLK, and output the latency write signal WLWT. The fourth clock shifter 134 may shift the mask write read signal MWT_RD by a period corresponding to N cycles of the clock CLK, and output the latency write signal WLWT. N may be set to a natural number.

The first shifting pulse output 135 may output the first shifting pulse STP<1> in response to the second write latency signal WL<2>. The first shifting pulse output 135 may output the output signal of the first clock shifter 131 as the first shifting pulse STP<1> in the case where the second write latency signal WL<2> is enabled to a logic high level.

The second shifting pulse output 136 may output the second shifting pulse STP<2> in response to the first and second write latency signals WL<1:2>. The second shifting pulse output 136 may output the output signal of the second clock shifter 132 as the second shifting pulse STP<2> in the case where the second write latency signal WL<2> is enabled to the logic high level. The second shifting pulse output 136 may output the output signal of the second clock shifter 132 as the second shifting pulse STP<2> in the case where the first write latency signal WL<1> is enabled to a logic high level.

The clock shifting circuit 13 may sequentially generate the first and second shifting pulses STP<1:2>, the mask write read signal MWT_RD and the latency write signal WLWT by shifting the write pulse WTP in synchronization with the clock CLK. For example, the first shifting pulse STP<1> may be generated at a time WL-11, the second shifting pulse STP<2> may be generated at a time WL-9, the mask write read signal MWT_RD may be generated at a time WL-7, and the latency write signal WLWT may be generated at a time WL-5. Generation at a time WL-K means generation at a time K clock before a time passed by a write latency. Generation times of the first and second shifting pulses STP<1:2>, the mask write read signal MWT_RD and the latency write signal WLWT may be set variously according to embodiments. The first clock shifter 131, the second clock shifter 132, the third clock shifter 133 and the fourth clock shifter 134 may be embodied by using the clock shifter illustrated in FIG. 4.

Figure 4:
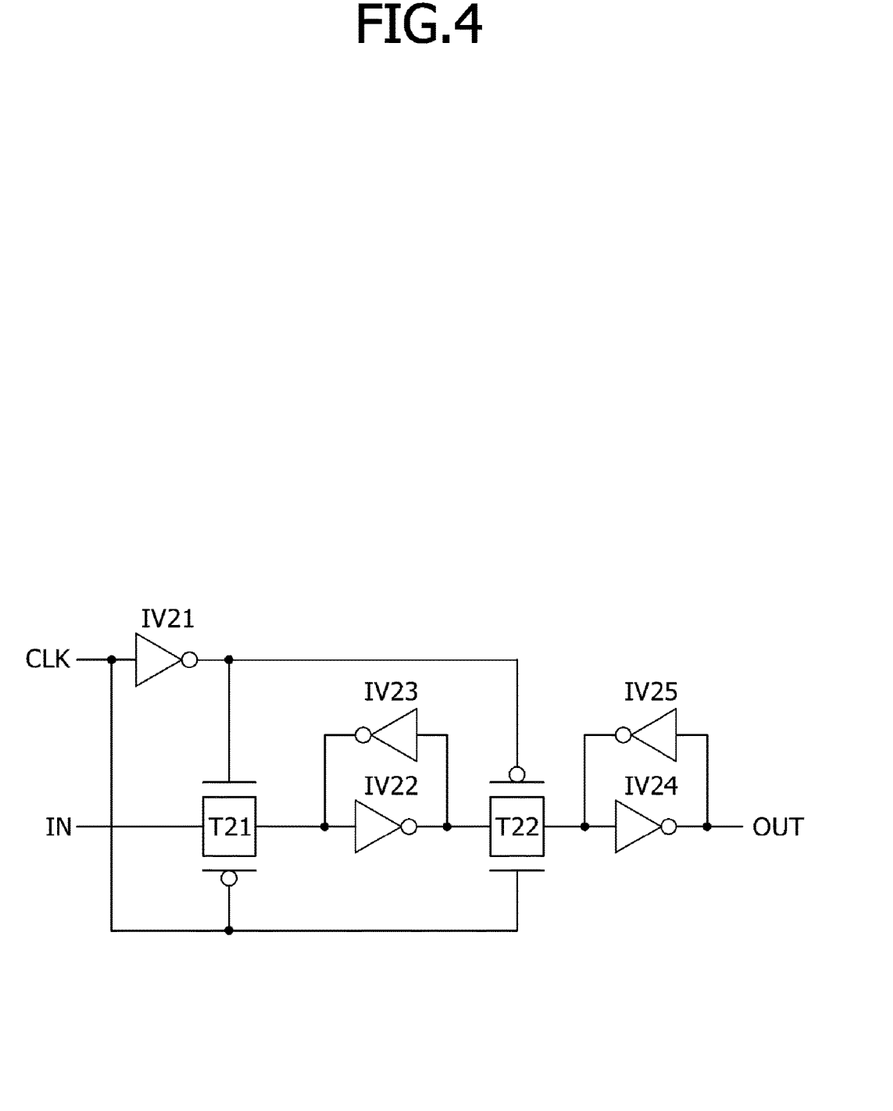
FIG. 4 is a circuit diagram illustrating a representation of an example of the clock shifter included in the clock shifting circuit illustrated in FIG. 3.

Referring to FIG. 4, a clock shifter may include inverters IV21, IV22, IV23, IV24 and IV25 and transfer gates T21 and T22. The transfer gate T21 may be turned on in the case where the clock CLK of a logic low level is inputted, and the transfer gate T22 may be turned on in the case where the clock CLK of a logic high level is inputted. The inverters IV22 and IV23 may latch the output signal of the transfer gate T21. The inverters IV24 and IV25 may latch the output signal of the transfer gate T22. The clock shifter may output an output signal OUT by shifting an input signal IN by a period corresponding to 1 cycle of the clock CLK. According to an embodiment, the clock shifter may be embodied to output an output signal OUT by shifting an input signal IN by a period corresponding to K cycles of the clock CLK.

Figure 5:
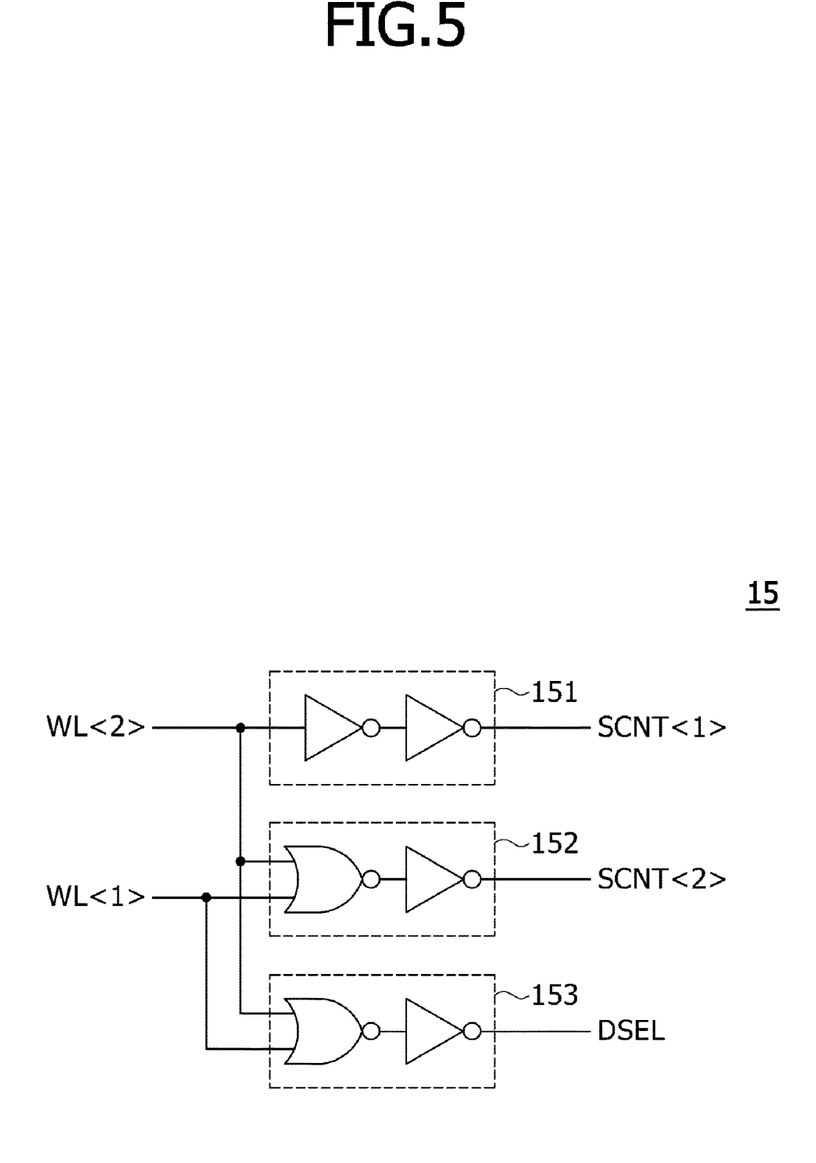
FIG. 5 is a circuit diagram illustrating a representation of an example of the delay control circuit included in the semiconductor device illustrated in FIG. 1.

Referring to FIG. 5, the delay control circuit 15 may include a first logic circuit 151, a second logic circuit 152, and a third logic circuit 153.

The first logic circuit 151 may buffer the second write latency signal WL<2> and output the first select control signal SCNT<1>. The first logic circuit 151 may output the first select control signal SCNT<1> of a logic high level in the case where the second write latency signal WL<2> is enabled to the logic high level. The second logic circuit 152 may receive the first write latency signal WL<1> and the second write latency signal WL<2>, perform an OR logic function, and output the second select control signal SCNT<2>. The second logic circuit 152 may generate the second select control signal SCNT<2> of a logic high level in the case where the first write latency signal WL<1> or the second write latency signal WL<2> is enabled to the logic high level. The third logic circuit 153 may receive the first write latency signal WL<1> and the second write latency signal WL<2>, perform an OR logic function, and generate the delay select signal DSEL. The third logic circuit 153 may generate the delay select signal DSEL of a logic high level in the case where the first write latency signal WL<1> or the second write latency signal WL<2> is enabled to the logic high level.

The delay control circuit 15 may generate the second select control signal SCNT<2> and the delay select signal DSEL which are set to the logic high level, in the case where the first write latency signal WL<1> is enabled to the logic high level. The delay control circuit 15 may generate the first and second select control signals SCNT<1:2> and the delay select signal DSEL which are set to the logic high level, in the case where the second write latency signal WL<2> is enabled to the logic high level. The delay control circuit may generate the first and second select control signals SCNT<1:2> and the delay select signal DSEL which are set to a logic high level, in the case where both the first and second write latency signals WL<1:2> are disabled to a logic low level.

Figure 6:
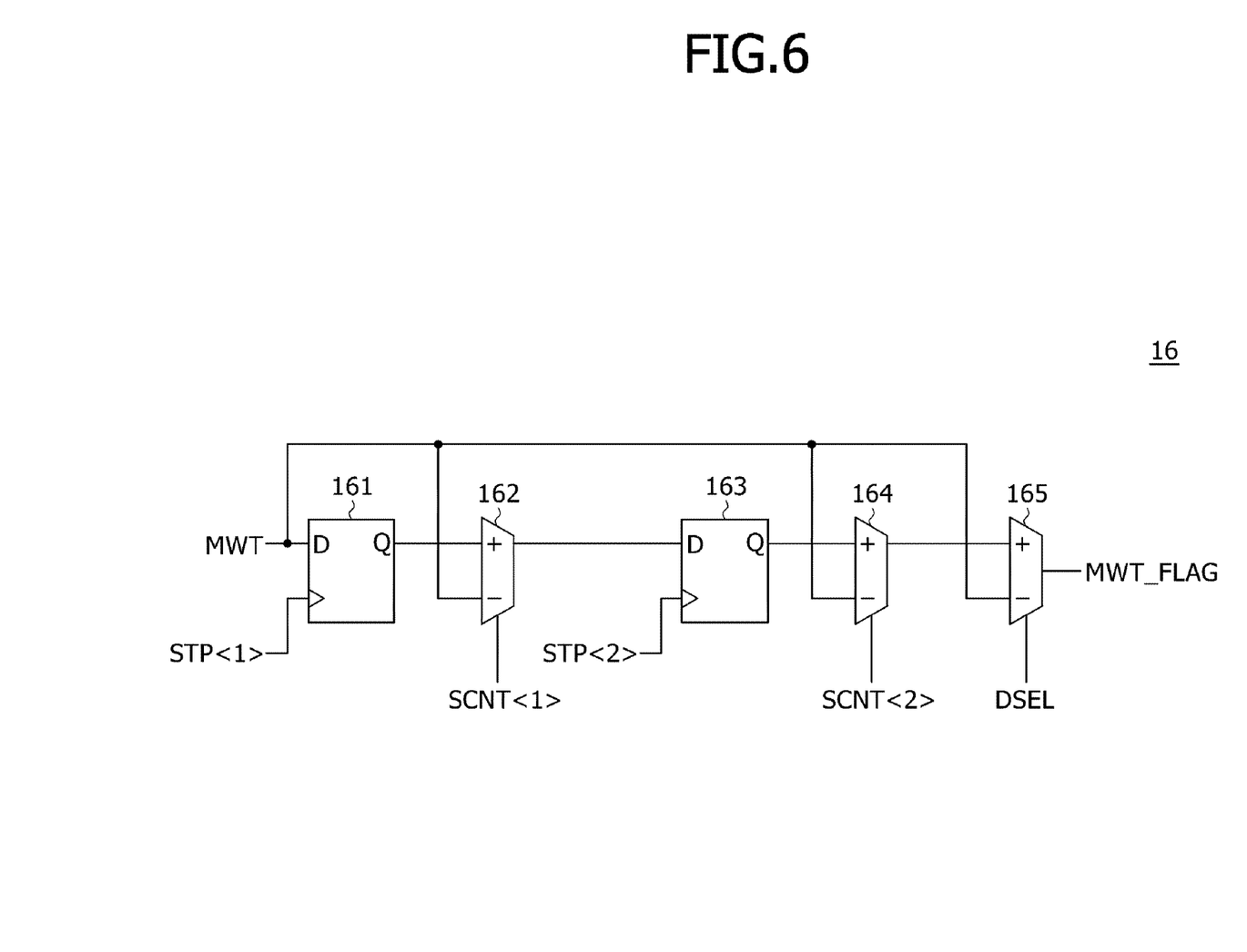
FIG. 6 is a circuit diagram illustrating a representation of an example of the flag generation circuit included in the semiconductor device illustrated in FIG. 1.

Referring to FIG, 6, the flag generation circuit 16 may include a first latch 161, a first selector 162, a second latch 163, a second selector 164, and a third selector 165.

The first latch 161 may latch the mask write command MWT in response to the first shifting pulse STP<1>, and output an output signal. The first latch 161 may latch the mask write command MWT in synchronization with a time at which the first shifting pulse STP<1> is generated, and output the output signal.

The first selector 162 may output selectively the output signal of the first latch 161 or the mask write command MWT in response to the first select control signal SCNT<1>. The first selector 162 may select and output the output signal of the first latch 161 in the case where the first select control signal SCNT<1> is the logic high level. The first selector 162 may select and output the mask write command MWT in the case where the first select control signal SCNT<1> is the logic low level.

The second latch 163 may latch the output signal of the first selector 162 in response to the second shifting pulse STP<2>, and output an output signal. The second latch 163 may latch the output signal of the first selector 162 in synchronization with a time at which the second shifting pulse STP<2> is generated, and output the output signal.

The second selector 164 may output selectively the output signal of the second latch 163 or the mask write command MWT in response to the second select control signal SCNT<2>. The second selector 164 may select and output the output signal of the second latch 163 in the case where the second select control signal SCNT<2> is the logic high level. The second selector 164 may select and output the mask write command MWT in the case where the second select control signal SCNT<2> is the logic low level.

The third selector 165 may output selectively the output signal of the second selector 164 or the mask write command MWT, as the mask write flag MWT_FLAG, in response to the delay select signal DSEL. The third selector 165 may select the output signal of the second selector 164 and output the mask write flag MWT_FLAG in the case where the delay select signal DSEL is the logic high level. The third selector 165 may select the mask write command MWT and output the mask write flag MWT_FLAG in the case where the delay select signal DSEL is the logic low level.

The flag generation circuit 16 may latch the mask write command MWT through the first latch 161 and the second latch 163 by the first and second shifting pulses STP<1:2> which are generated in the case where the second write latency signal WL<2> is the logic high level and the first and second select control signals SCNT<1:2> and the delay select signal DSEL which are set to the logic high level, and output the mask write flag MWT_FLAG. The flag generation circuit 16 may latch the mask write command MWT through the second latch 163 by the second shifting pulse STP<2> which is generated in the case where the first write latency signal WL<1> is the logic high level and the second select control signal SCNT<2> and the delay select signal DSEL which are set to the logic high level, and output the mask write flag MWT_FLAG. The flag generation circuit 16 may output the mask write command MWT as the mask write flag MWT_FLAG by the delay select signal DSEL which is generated and set to the logic low level in the case where the first write latency signal WL<1> and the second write latency signal WL<2> are the logic low level.

Figure 7:
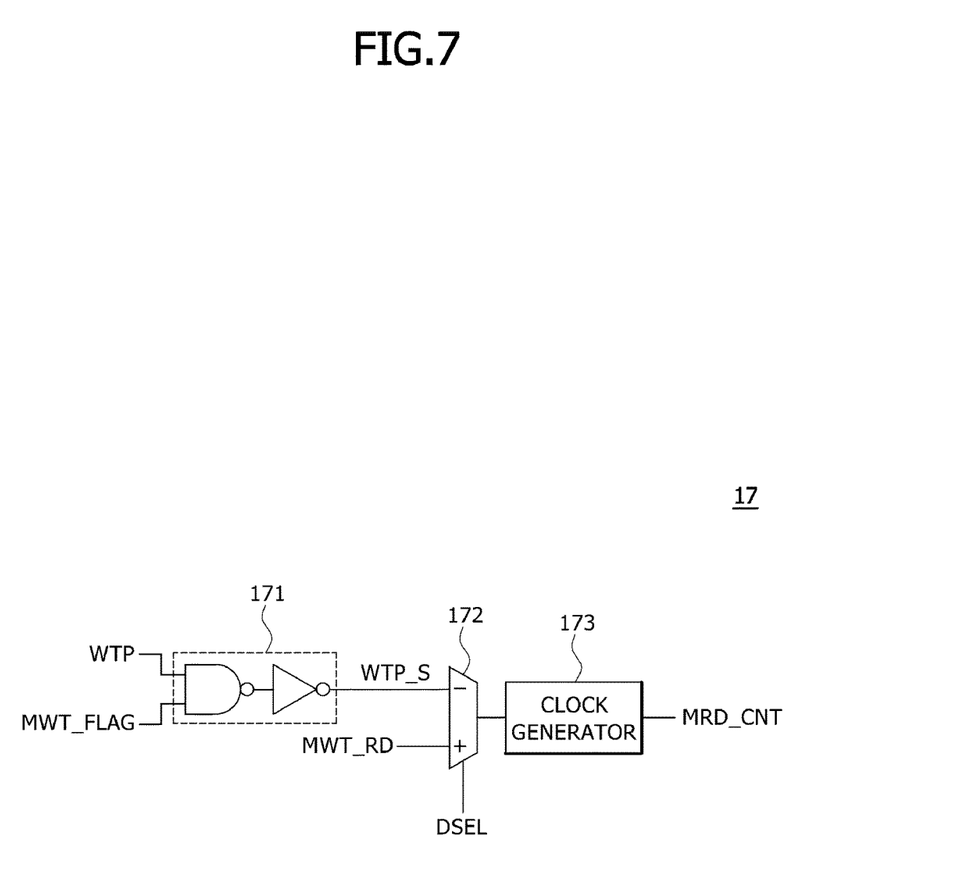
FIG. 7 is a diagram illustrating a representation of an example of the mask read control circuit included in the semiconductor device illustrated in FIG. 1.

Referring to FIG. 7, the mask read control circuit 17 may include a signal synthesizer 171, a selective output 172, and a clock generator 173.

The signal synthesizer 171 may generate a synthesized write pulse WTP_S in response to the mask write flag MWT_FLAG and the write pulse WTP. The signal synthesizer 171 may generate the synthesized write pulse WTP_S to a logic high level in the case where the mask write flag MWT_FLAG is set to a logic high level and the write pulse WTP is generated to a logic high level. The selective output 172 may output the synthesized write pulse WTP_S or the mask write read signal MWT_RD in response to the delay select signal DSEL, The selective output 172 may select and output the mask write read signal MWT_RD in the case where the delay select signal DSEL is the logic high level. The selective output 172 may select and output the synthesized write pulse WTP_S in the case where the delay select signal DSEL is the logic low level. The clock generator 173 may generate the mask read control signal MRD_CNT from the synthesized write pulse WTP_S or the mask write read signal MWT_RD which is outputted from the selective output 172.

The operation of the semiconductor device configured as mentioned above will be described below by being divided into a first period in which a write latency is equal to or greater than a first predetermined value, a second period in which a write latency is less than the first predetermined value and is equal to or greater than a second predetermined value and a third period in which a write latency is less than the second predetermined value. The first predetermined value and the second predetermined value may be set variously according to embodiments. The first predetermined value may be set to be greater than the second predetermined value.

In the case where the second write latency signal WL<2> is enabled to the logic high level in the first period, the first and second shifting pulses STP<1:2> are generated, and the first and second select control signals SCNT<1:2> and the delay select signal DSEL are set to the logic high level. The mask write command MWT is latched through the first latch 161 and the second latch 162, and is outputted as the mask write flag MWT_FLAG. In the state in which the delay select signal DSEL is set to the logic high level, the mask read control signal MRD_CNT is generated in synchronization with a time at which the mask write read signal MWT_RD is generated.

In the case where the first write latency signal WL<1> is enabled to the logic high level in the second period, the second shifting pulse STP<2> is generated, and the second select control signal SCNT<2> and the delay select signal DSEL are set to the logic high level. The mask write command MWT is latched through the second latch 163, and is outputted as the mask write flag MWT_FLAG. In the state in which the delay select signal DSEL is set to the logic high level, the mask read control signal MRD_CNT is generated in synchronization with a time at which the mask write read signal MWT_RD is generated.

In the case where both the first and second write latency signals <1:2> are disabled to the logic low level in the third period, the delay select signal DSEL is set to the logic low level. The mask write command MWT is outputted as the mask write flag MWT_FLAG. In the state in which the delay select signal DSEL is set to the logic low level, the mask read control signal MRD_CNT is generated in synchronization with a time at which the synthesized write pulse WTP_S is generated. In an embodiment, for example, the clock shifting circuit 13 blocks generation of the shifting pulses STP<1:M> in the third period.

As is apparent from the above descriptions, the semiconductor device in accordance with an embodiment controls a timing for performing an internal read operation, depending on a write latency, in the case where a mask write operation for an error scrub operation is performed. Therefore, even though an operating frequency changes, the error scrub operation may be performed stably.

The semiconductor device described above with reference to FIGS. 1 to 7 may be applied to an electronic system which includes a memory system, a graphic system, a computing system or a mobile system. For example, referring to FIG. 8, an electronic system 1000 in accordance with an embodiment may include a data storage 1001, a memory controller 1002, a buffer memory 1003, and an input and output (input/output) interface 1004.

Figure 8:
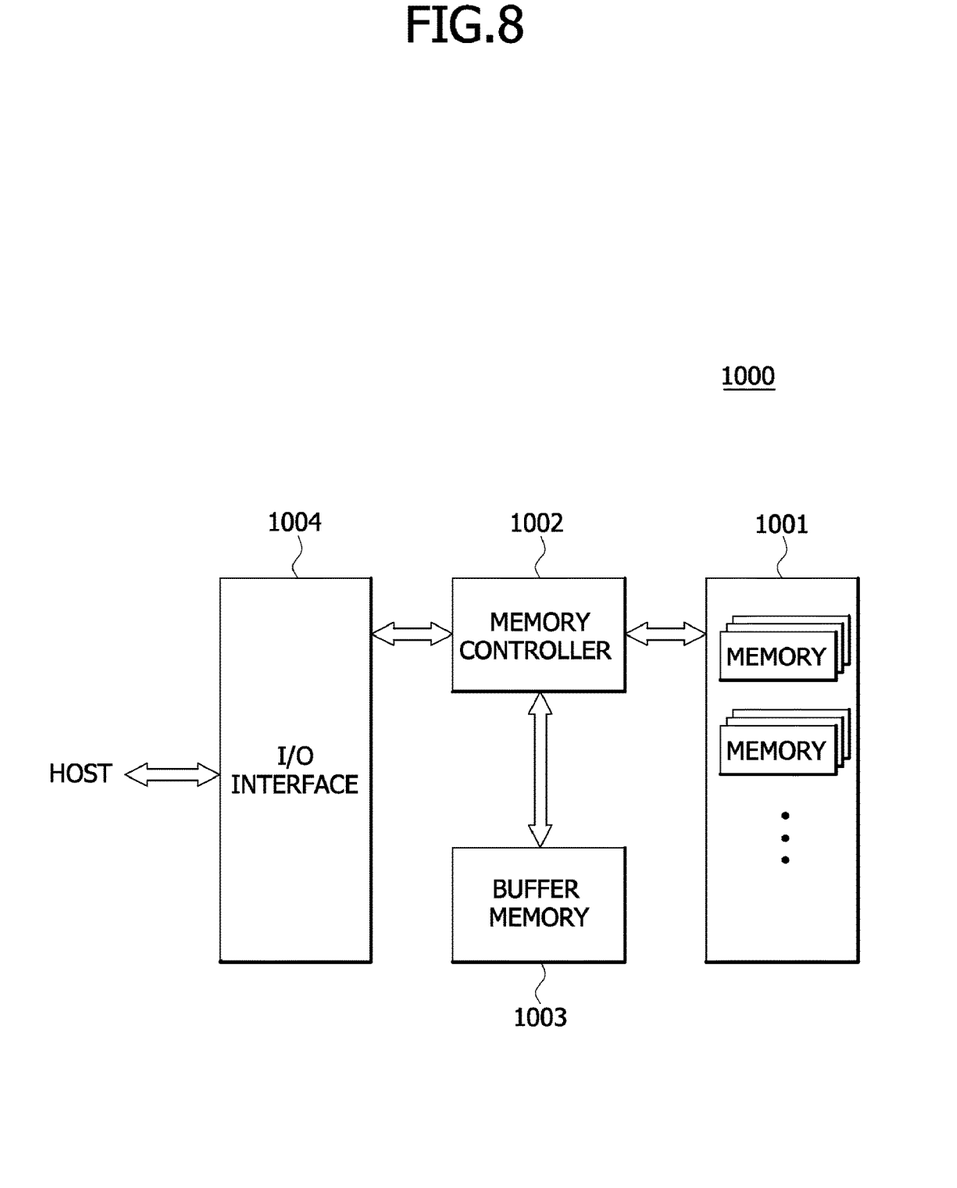
FIG. 8 is a diagram illustrating a representation of an example of the configuration of an electronic system to which the semiconductor device illustrated in FIGS. 1 to 7 is applied.

The data storage 1001 stores data applied from the memory controller 1002, and reads out stored data and outputs the read-out data to the memory controller 1002, according to control signals from the memory controller 1002. The data storage 1001 may include the semiconductor devices illustrated in FIG. 1. The data storage 1001 may include a nonvolatile memory capable of not losing and continuously storing data even though power supply is interrupted. A nonvolatile memory may be realized as a flash memory such as a NOR flash memory and a NAND flash memory, a phase change random access memory (PRAM), a resistive random access memory (RRAM), a spin transfer torque random access memory (STTRAM) or a magnetic random access memory (MRAM).

The memory controller 1002 decodes commands applied through the input/output interface 1004 from an external device (a host), and controls input/output of data with respect to the data storage 1001 and the buffer memory 1003 according to decoding results. While the memory controller 1002 is illustrated as one block in FIG. 8, it is to be noted that, in the memory controller 1002, a controller for controlling a nonvolatile memory and a controller for controlling the buffer memory 1003 as a volatile memory may be independently configured.

The buffer memory 1003 may temporarily store data to be processed in the memory controller 1002, that is, data to be inputted and outputted to and from the data storage 1001. The buffer memory 1003 may store data applied from the memory controller 1002 according to a control signal. The buffer memory 1003 reads out stored data and outputs the read-out data to the memory controller 1002. The buffer memory 1003 may include a volatile memory such as a DRAM (dynamic random access memory), a mobile DRAM and an SRAM (static random access memory).

The input/output interface 1004 provides a physical coupling between the memory controller 1002 and the external device (the host) such that the memory controller 1002 may receive control signals for input/output of data from the external device and exchange data with the external device. The input/output interface 1004 may include one among various interface protocols such as USB, MMC, PCI-E, SAS, SATA, PATA, SCSI, ESDI and IDE.

The electronic system 1000 may be used as an auxiliary memory device or an external storage device of the host. The electronic system 1000 may include a solid state disk (SSD), a USB memory (universal serial bus memory), a secure digital (SD) card, a mini-secure digital (mSD) card, a micro SD card, a secure digital high capacity (SDRC) card, a memory stick card, a smart media (SM) card, a multimedia card (MMC), an embedded MMC (eMMC), or a compact flash (CF) card.

While various embodiments have been described above, it will be understood to those skilled in the art that the embodiments described are by way of example only. Accordingly, the semiconductor devices described herein should not be limited based on the described embodiments.

What is claimed is:

1. A semiconductor device comprising:
 a delay control circuit configured for generating first and second select control signals and a delay select signal based on write latency signals; and
 a flag generation circuit configured for generating a mask write flag by latching a mask write command or outputting the mask write command as the mask write flag, based on the first and second select control signals and the delay select signal.

2. The semiconductor device according to claim 1, wherein the delay control circuit is configured for generating the first and second select control signals and the delay select signal of which logic level combinations are determined depending on the logic level combinations of the write latency signals.

3. The semiconductor device according to claim 1, wherein the write latency signals include a first write latency signal and a second write latency signal.

4. The semiconductor device according to claim 3, wherein the second write latency signal is enabled in a first period, and the first period is set as a period in which a write latency is equal to or greater than a first predetermined value.

5. The semiconductor device according to claim 4, wherein the first write latency signal is enabled in a second period, and the second period is set as a period in which a write latency is less than a first predetermined value and is equal to or greater than a second predetermined value.

6. The semiconductor device according to claim 3, wherein the delay control circuit is configured for generating the second select control signal and the delay select signal which are set to a first logic level in the case where the first write latency signal is enabled.

7. The semiconductor device according to claim 3, wherein the delay control circuit is configured for generating the first and second select control signals and the delay select signal which are set to a first logic level in the case where the second write latency signal is enabled.

8. The semiconductor device according to claim 7, wherein the delay control circuit is configured for generating the first and second select control signals and the delay select signal which are set to a second logic level in the case where both the first and second write latency signals are disabled.

9. The semiconductor device according to claim 1, wherein the flag generation circuit is configured for generating the mask write fag by latching the mask write command or outputting the mask write command as the mask write flag, based on shifting pulses.

10. The semiconductor device according to claim 9, further comprising:
   a clock shifting circuit configured for shifting a write pulse which is synchronized with a clock, based on the write latency signals, and generating the shifting pulses.

11. The semiconductor device according to claim 10,
   wherein the shifting pulses include a first shifting pulse and a second shifting pulse, and
   wherein the flag generation circuit comprises:
   a first latch configured for latching the mask write command in synchronization with the first shifting pulse, and outputting an output signal; and
   a second latch configured for latching the output signal of the first latch in synchronization with the second shifting pulse, and outputting an output signal.

12. The semiconductor device according to claim 11, wherein the flag generation circuit further comprises:
   a first selector configured for transferring the output signal of the first latch to the second latch or transferring the mask write command to the second latch, based on the first select control signal;
   a second selector configured for outputting the output signal of the second latch or outputting the mask write command, based on the second select control signal; and
   a third selector configured for outputting an output signal of the second selector as the mask write flag or outputting the mask write command as the mask write flag, based on the delay select signal.

13. The semiconductor device according to claim 12, wherein, in a period in which a write latency is equal to or greater than a first predetermined value, the first selector transfers the output signal of the first latch to the second latch, the second selector selects and outputs the output signal of the second latch, and the third selector outputs the output signal of the second selector as the mask write flag.

14. The semiconductor device according to claim 12, wherein, in a period in which a write latency is less than the first predetermined value and is equal to or greater than a second predetermined value, the first selector transfers the mask write command to the second latch, the second selector selects and outputs the output signal of the second latch, and the third selector outputs the output signal of the second selector as the mask write flag.

15. The semiconductor device according to claim 12, wherein, in a period in which a write latency is less than the second predetermined value, the third selector outputs the mask write command as the mask write flag.

* * * * *